United States Patent [19]

Wilcox et al.

[11] Patent Number: 4,996,691
[45] Date of Patent: Feb. 26, 1991

[54] INTEGRATED CIRCUIT TESTING METHOD AND APPARATUS AND INTEGRATED CIRCUIT DEVICES FOR USE THEREWITH

[75] Inventors: Philip S. Wilcox, Nepean; Benoit Nadeau-Dostie, Aylmer; Vinod K. Agarwal, Brossard, all of Canada

[73] Assignee: Northern Telecom Limited, Montreal, Canada

[21] Appl. No.: 247,258

[22] Filed: Sep. 21, 1988

[51] Int. Cl.$^5$ .............................................. G06F 11/00
[52] U.S. Cl. .................................. 371/68.1; 371/15.1; 371/22.3; 371/24; 371/25.1
[58] Field of Search ................... 371/22.3, 68.1, 68.3, 371/71, 67.1, 25.1, 24, 22.1, 22.5, 22.6, 22.4, 15.1; 364/200 MS File, 900 MS File

[56] References Cited

U.S. PATENT DOCUMENTS

| | | | |
|---|---|---|---|
| 4,244,048 | 1/1981 | Tsui | 371/22.3 |
| 4,426,699 | 1/1984 | Tanaka | 371/68.1 |
| 4,503,537 | 3/1985 | McAnney | 371/22.3 |
| 4,509,008 | 4/1985 | Dasgupta | 371/22.3 |
| 4,602,210 | 7/1986 | Fasang | 371/22.3 |
| 4,843,608 | 6/1989 | Fu | 371/68.1 |
| 4,879,717 | 11/1989 | Sauerwald | 371/22.3 |

*Primary Examiner*—Jerry Smith
*Assistant Examiner*—Robert W. Beausoliel
*Attorney, Agent, or Firm*—Morrison Law Firm, Thomas Morrison

[57] ABSTRACT

In a so-called "scan-design" arrangement for testing integrated circuits, whether at the device level or at system level, problems associated with the storage and handling of vast amounts of data from increasingly complex devices are addressed by testing a pair of identical integrated circuits simultaneously and using the binary vector generated by scanning one of these integrated circuits as the reference against which to compare the binary vector produced by scanning the other integrated circuit. A plurality of "scan-designed" integrated circuits may be connected in series, possibly in a ring, and each compared with its predecessor. Zero-display coupling across each device may be employed to allow each successive integrated circuit to be compared with the same reference circuit in the chain or ring.

11 Claims, 1 Drawing Sheet

4,996,691

INTEGRATED CIRCUIT TESTING METHOD AND APPARATUS AND INTEGRATED CIRCUIT DEVICES FOR USE THEREWITH

FIELD OF INVENTION

The invention relates to testing arrangements for integrated circuits and is especially applicable to the testing of integrated circuits of the so-called "scan-design" type, which have provision for connecting some, if not all, of their memory elements in series to receive a binary test vector. Embodiments of the invention may find application in the testing of two or more identical circuits on a particular integrated circuit device or on separate devices within the value system for example upon the same printed circuit board.

In this specification, the term "integrated circuit" will be used to cover a portion of the circuitry laid out on a semiconductor device or the whole of such a circuit on semiconductor device.

Complex integrated circuits present problems to the test engineer because of the large numbers of component gates, etc. to be tested and the complexity of their interconnections. As these integrated circuits become more complex, the generation and storage of massive quantities of test data becomes a serious problem. When integrated circuits are incorporated into overall systems and high quality tests are carried out on the overall system or integrated system, the problem becomes worse. Various attempts have been made to solve this problem and have centered upon the use of "built-inself-test" capabilities allowing the device to be tested effectively and economically. Various built-in test techniques have been proposed ranging from selfoscillation to functional pattern testing with microprogrammed devices to random pattern testing. One structured design approach so called "scan-design" typically provides for all of the memory devices (flip-flops) in the integrated circuit to be connected in series, effectively like one long shift register, between a test input and a test output of the integrated circuit. A binary vector, a sequence of bits, is clocked through this chain of memory devices and is monitored at the output. The output sequence is then compared with a stored reference or signature to verify the integrated circuit. High quality tests are becoming mandatory at all levels of integration and can only be performed satisfactorily if structured with the basic design of the integrated circuit. An example of scan design is disclosed in a paper by John A. LeBlanc entitled "LOCST: A Built-In Self-Test Technique" *IEEE Design & Test of Computers*, Nov., 1984. Such a design gives the integrated circuit device the capability to generate its own test pattern set and to compress the test results into a compact pass fail indication.

Although pseudo random pattern generation plus signature analysis will alleviate the problem of massive amounts of data, and is very easy to implement in hardware, it is nevertheless not entirely satisfactory because the need still remains to store the expected circuit response. Moreover, signature analysis entails loss of data and increases the risk of a faulty device escaping detection due to "aliasing".

BRIEF SUMMARY OF THE INVENTION

According to one aspect of the present invention, there is provided a method of testing at least two integrated circuits each comprising a serial input port and a serial output port and a plurality of memory devices, comprising the steps of:

(i) in each integrated circuit, connecting said memory devices in series between said serial input port and said output port;

(ii) initializing each series by passing a binary vector therethrough;

(iii) clocking each said circuit at least once in normal operating mode;

(iv) extracting the resulting binary vector from each said series of memory devices; and (v) comparing the binary vector from one of said integrated circuits with the binary vector from the other of said integrated circuits and registering any difference.

The binary vectors applied to the series of memory devices could be stored patterns or hardware generated patterns.

Comparison of the output of one series of memory devices with the other may conveniently be carried out bit-by-bit as the resulting vector is clocked through the respective chains of memory devices. Such comparison may employ a latch at the output of the one series of memory devices, the latch being fed by the output of the last memory device in the series or by the output of the last memory device in said other integrated circuit. The condition of the latch may then be monitored to determine whether or not there is nonconformity between the outputs of the two series of memory devices.

An advantage of comparing each integrated circuit with a predecessor especially bit-by-bit as in the preferred embodiment, is that there is no need to store a reference pattern and compare each output of an integrated circuit with it.

According to a second aspect of the invention, an integrated circuit for testing by the method of the first aspect comprises an input port and an output port, a plurality of memory elements connectable in series between said input port and said output port, means for connecting one end of said series of memory elements selectively to either said input port or a second input port, and means connected between said other end of said series of memory devices and a second input port for comparing bits appearing at the end of the scan chain with bits appearing at the second port, and indicating any differences.

The comparing means may conveniently comprise an exclusive-OR gating means, for example, an exclusive-OR gate, having one input connected to the last of said series of memory elements and the other input connected to said second input port. The output of the exclusive-OR gating means may be recorded by a flipflop.

Additional switching means may be provided to couple, selectively, either the output end of the series of memory elements, or the second input port, to said output port.

According to a third aspect, the invention comprises a system for testing at least two integrated circuits each having a plurality of memory devices connectable in series between an input port and an output port of the circuit, the output port of one integrated circuit being connected to the input of the other integrated circuit, said system comprising:

(i) means for interconnecting said plurality of memory devices in series between an input port and an output port;

(ii) means for initializing each series by passing a binary vector therethrough;

(iii) means for clocking each said circuit at least once in its normal operating mode;

(iv) means for extracting the binary vector resulting from such clocking from each of said series;

(v) means for comparing the binary vector extracted from one of said integrated circuits with the binary vector extracted from the other of said integrated circuits and indicating any differences.

The comparing means may compare the binary vectors bit-by-bit as they emerge from the scan chains or series of memory devices and may conveniently comprise an exclusive-OR gating arrangement with a latch or the like to record any differences.

An advantage of embodiments of the invention is that they do not require massive test data storage and avoid the weakness of data compression. They do so by taking advantage of the fact that there are often multiple copies of the same integrated circuit either on the same chip or in a system and hence carry out the testing by comparing the responses of the different circuits with each other. The devices may be connected in a ring, with the input port of one device connected to the output port of the preceding device in the ring. The second or "scan" inputs of all the devices are all connected back to the input to the first device.

BRIEF DESCRIPTION OF THE DRAWINGS

Embodiments of the invention will now be described, by way of example only, with reference to the accompanying drawings, in which.

DETAILED DESCRIPTION OF A PREFERRED EMBODIMENT

Figure 1:
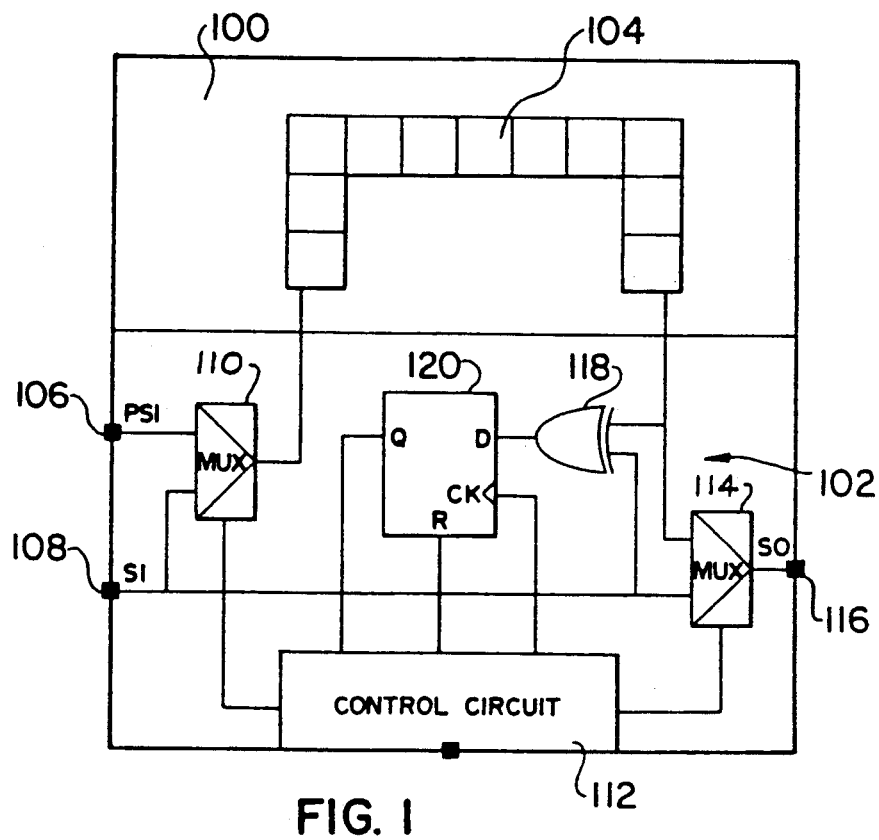
FIG. 1 is a simplified schematic diagram of an integrated circuit incorporating a test interface.

Referring now to FIG. 1, an integrated circuit is shown as having two main parts which are not drawn to scale. The main operational part of the circuit comprising, among other things, scannable or combinational logic, is designated by the numeral 100. A test interface 102 is also fabricated as part of the integrated circuit. All of the memory devices in the operational part of the integrated circuit each have a multiplexer (not shown) to switch them between NORMAL and SCAN modes. For the latter mode, the memory devices are connected in series to form a so-called "scan chain" 104.

The test interface 102 comprises two serial input ports, 106 and 108, designated PSI and SI, respectively, connected to the inputs of a multiplexer 110, the output of which is connected to one end of the chain of memory devices 104. Switching of the multiplexer 110 is controlled by a test control circuit 112.

A second multiplexer, 114, has its output connected to the output port 116 of the integrated circuit. One input of multiplexer 114 is connected to the output end of the chain of memory devices 104 and the other input is connected directly to the input port 108. The second multiplexer 114 also is controlled by the test control circuit 112. The output end of the scan chain 104 and the input port 108 are also connected to the respective inputs of an exclusive-OR gate 118, the output of which is connected to the D input of a D-type flip-flop 120. The flip-flop 120 is controlled by the test control circuit 112, which also monitors its Q output. The "control logic" can take several forms. Its purpose is to provide a method for controlling the scan testing process and controlling the compare circuitry multiplexers and flip-flop. The control logic could be direct inputs from IC pins or a standard test interface such as (a) ETM as defined by the U.S. DOD VHSIC program.

(b) P1149.1—an evolving IEEE standard.

Figure 2:
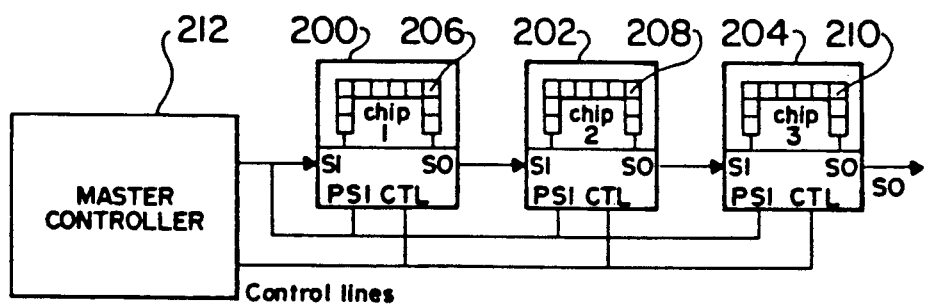
FIG. 2 is an illustration of three such integrated circuits connected in series for testing purposes.

During a test, a plurality of these integrated circuits are connected in a chain as illustrated in FIG. 2. Although FIG. 2 shows only three integrated circuits 200, 202 and 204, many more can be tested and may form a loop or ring. When a loop or ring is employed, the loop may be closed by an external switch or multiplexer.

Each of the integrated circuits 200, 202 and 204 is as shown in FIG. 1, and has its memory devices 206, 208, 210, respectively, connected in series between an input port SI and an output port SO. The input port SI of each integrated circuit 202, 204 is connected to the output port SO of its predecessor in the chain. The input port SI of integrated circuit 200 is connected in parallel (or common) to the second input ports PSI of all three integrated circuits 200, 202 and 204, and is connected to a master controller 212 which serves to control the test and is a source of the binary vector or pattern. The controller 212 is connected to the test control circuits 112 on the integrated circuits under test.

The binary vector is thus applied by master controller 212 to all three PSI ports simultaneously and also to the SI input of integrated circuit 200. Internally, each integrated circuit's controller 112 connects the scan chain 104 of series memory devices to the PSI input and clocks the vector through the scan chain 104 to initialize the logic. Prompted by the master controller 212, each control circuit 112 then clocks the circuit and captures its response in the memory devices of the scan chain. The controller 112 then extracts the resulting binary vector and, at the same time, scans for differences using the latch 120 and exclusive-OR gate 118. Any differences are indicated by the control circuit 112 as potential faults.

It will be appreciated that the first integrated circuit in the chain will compare its own output with its own input and so will give a faulty reading. However, if the second integrated circuit is "good", it can usually be inferred that the first integrated circuit is "good" also.

Thus, should the test indicate that there is a fault, which particular device is faulty can be determined using logical deduction and observation.

More precise diagnosis can be obtained by a modified procedure which employs the multiplexer 114 shown in FIG. 1. The controller 112 switches the multiplexer 114 to disconnect the integrated circuit's own scan chain 104 from the output port 116 and instead connect the SI input port 108 directly to the output port 116. This effects a zero-delay bypass and is done to all of the integrated circuits except the reference device (typically the first) since the output of the scan chain of the reference must be applied to its output for passing to the other devices. Consequently, all subsequent integrated circuits compare their outputs with the same reference output. Should the reference device prove faulty, a different one of the integrated circuits can be selected as the reference. "Stepping" through the chain in this way enables a faulty integrated circuit to be identified quickly.

Exact diagnosis is not possible with only two devices, in which case other diagnostic tools, such as signature analysis, could be used once a fault has been detected using the present invention. The particular location in the binary vector that a mismatch occurs will give an indication as to which part of the integrated circuit is faulty, facilitating more specific investigation.

It should be noted that the integrated circuit and test interface depicted in FIG. 1 need not occupy the whole of a single semiconductor device but could comprise one of several identical circuits on the same chip for example, a so-called quad chip. On the other hand, the invention also comprehends the testing of separate integrated circuits, so long as they are effectively identical so far as scan design is concerned.

Alternatively, it is envisaged that the output of the last integrated circuit could be applied to the input of the first integrated circuit using, for example, a multiplexer.

The chain or ring can be composed of several different types of integrated circuit. It is only necessary that similar circuits be connected adjacent each other in the chain or ring. Of course, connecting two chips which are not identical will result in compare failures. All integrated circuits can then be tested at the same time, with random or deterministic patterns. The deterministic pattern for one circuit type will look like random patterns for another. Thus, each group of integrated circuits can have a deterministic set of patterns for random pattern resistant faults and the rest of the faults can be covered by the deterministic patterns used to test other groups of devices.

Although an exclusive-OR gate has been described, it will be appreciated that the gating means may comprise alternative devices to provide the exclusive-OR function.

Moreover, an OR gate might be interposed between the exclusive-OR gate 118 and the O input of the latch 120, one input of the OR gate connected to the output of the exclusive-OR gate 118 and the other input connected to the Q input to the latch 120. This arrangement ensures that the "error" condition is maintained as long as the control circuit 112 does not reset the latch 120.

We claim:

1. A method of testing at least two integrated circuits, each comprising a serial input port and a serial output port, and a plurality of memory devices, comprising the steps of:
   (i) in each integrated circuit, connecting said memory devices in series between said serial input port and said output port;
   (ii) initializing each series by passing a binary vector therethrough;
   (iii) clocking each said circuit at least once in normal operating mode;
   (iv) extracting from each said series of memory devices a binary vector resulting from said clocking; and
   (v) comparing the resulting binary vector from one of said integrated circuits with the resulting binary vector from the other of said integrated circuits and registering any difference.

2. A method as defined in claim 1, wherein bits of the resulting binary vector extracted from one series are compared with the corresponding bits of the resulting binary vector extracted from the other series individually as said resulting binary vectors are extracted from their respective series of memory devices.

3. A method as defined in claim 2, wherein such comparison is effected by means of a latch and an exclusive-OR gating means, said gating means having inputs connected to respective outputs of both series, the output of the latch indicating when the inputs to the exclusive-OR gating means are not the same.

4. A method as defined in claim 1, 2 or 3, wherein each integrated circuit other than a preselected one integrated circuit has its said resulting binary vector compared with the resulting binary vector of said preselected one integrated circuit.

5. A system for testing at least two integrated circuits each having a plurality of memory devices connectable in series between an input port and an output port of the circuit, said system comprising:
   (i) means interconnecting the output port of one integrated circuit to the input port of the other integrated circuit,
   (ii) means for effecting interconnection of said plurality of memory devices in series between an input port and an output port;
   (iii) means for initializing each series by passing a binary vector therethrough;
   (iv) means for clocking each said circuit at least once in its normal operating mode;
   (v) means for extracting the binary vector resulting from such clocking from each of said series;
   (vi) means for comparing the binary vector extracted from one of said integrated circuits with the binary vector extracted from the other of said integrated circuits and indicating any differences.

6. A system as defined in claim 5, wherein the comparing means is arranged to compare bits of said binary vector extracted from said one of said integrated circuits individually with corresponding bits of said binary vector extracted from the other of said integrated circuits.

7. A system as defined in claim 6, wherein said comparing means comprises a latch and an exclusive-OR gating means, said gating means having one input connected to an output end of said series of memory devices and a second input connected to said input port.

8. An integrated circuit suitable for use in a testing system in which binary vectors are applied to a plurality of memory devices interconnected in series in said integrated circuit, said integrated circuit comprising a plurality of memory devices interconnectable in series between a first input port and an output port of said integrated circuit,
   means for connecting one end of said series of memory devices to either of said first input port and a second input port, means for connecting the other end of said series of memory devices to said output port, and means connected between said other end of said series of memory devices and said second input port for comparing binary bits of a binary vector extracted from said series of memory devices with bits of a binary vector applied to said second input port, and indicating any differences.

9. An integrated circuit as defined in claim 8, said means for connecting the other end of said series of memory devices comprising switching means for selectively connecting said other end of the series of memory devices, or said second input port, to said output port.

10. An integrated circuit as defined in claim 8 or 9, wherein said comparing means is arranged to compare the bits of the binary vector extracted from said series of memory devices individually with the corresponding bits of the binary vector applied to said second input port.

11. An integrated circuit as defined in claim 10, wherien said comparing means comprises a latch and an exclusive-OR gating means, said gating means having one input connected to an output end of said series of memory devices and a second input connected to said second input port.

* * * * *